(12) United States Patent
Wu et al.

(10) Patent No.: US 10,459,019 B2
(45) Date of Patent: Oct. 29, 2019

(54) ELECTROMAGNETIC SENSOR

(71) Applicant: HON HAI PRECISION INDUSTRY CO., LTD., New Taipei (TW)

(72) Inventors: Hung-Yu Wu, New Taipei (TW); Chin-Hai Hsu, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 112 days.

(21) Appl. No.: 15/870,881

(22) Filed: Jan. 13, 2018

(65) Prior Publication Data

US 2019/0094282 A1     Mar. 28, 2019

(30) Foreign Application Priority Data

Sep. 28, 2017  (CN) .......................... 2017 1 0899990

(51) Int. Cl.
*G01R 29/08* (2006.01)
*H01F 7/02* (2006.01)
*H04R 1/00* (2006.01)

(52) U.S. Cl.
CPC ....... *G01R 29/0878* (2013.01); *H01F 7/0289* (2013.01); *H04R 1/00* (2013.01)

(58) Field of Classification Search
CPC ...... G01R 29/0878; H01F 7/0289; H04R 1/00
USPC ...................... 324/244.1, 244, 200
See application file for complete search history.

(56) References Cited

U.S. PATENT DOCUMENTS

| | | | |
|---|---|---|---|
| 6,617,972 B2 * | 9/2003 | Takarada | G08B 21/0484 324/538 |
| 8,779,729 B2 * | 7/2014 | Shiraishi | G06F 1/3212 320/155 |
| 9,894,442 B2 | 2/2018 | Salvatti | |
| 2012/0098518 A1 * | 4/2012 | Unagami | G01R 22/066 324/74 |

FOREIGN PATENT DOCUMENTS

| CN | 104469629 A | 3/2015 |
|---|---|---|
| CN | 107113506 A | 8/2017 |

* cited by examiner

*Primary Examiner* — Giovanni Astacio-Oquendo
(74) *Attorney, Agent, or Firm* — ScienBiziP, P.C.

(57) ABSTRACT

An electromagnetic sensor includes a first magnetic pack unit and a first magnetic unit. The first magnetic unit forms a first magnetic pack, a second magnetic pack, and a third magnetic pack in a first direction. The structure of the electromagnetic sensor enables even and uniform distribution of the magnetic field on the electrode and provides a good sound effect under different frequencies.

19 Claims, 10 Drawing Sheets

ELECTROMAGNETIC SENSOR

FIELD

The subject matter herein generally relates to electromagnetic sensors.

BACKGROUND

In general, Halbach magnet arrangement can improve the intensity of magnetic fields and magnetic lines. The diaphragm of planar electromagnetic sensor is deformed uniformly during vibration, so achieving a good sound effect under different frequency responses is problematic. Improvement in the art is preferred.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Figure 1:
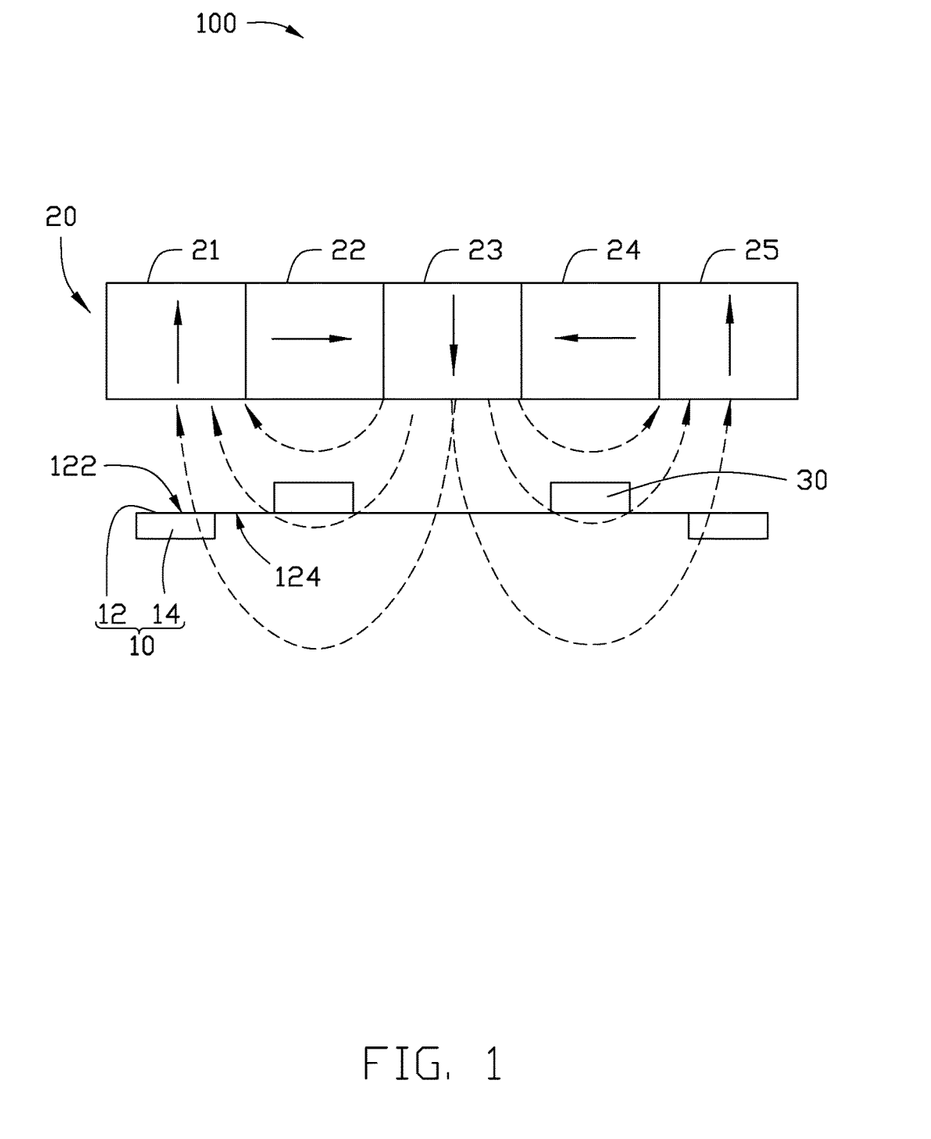
FIG. 1 is a diagram of an exemplary embodiment of an electromagnetic sensor according to the present disclosure.
Figure 2:
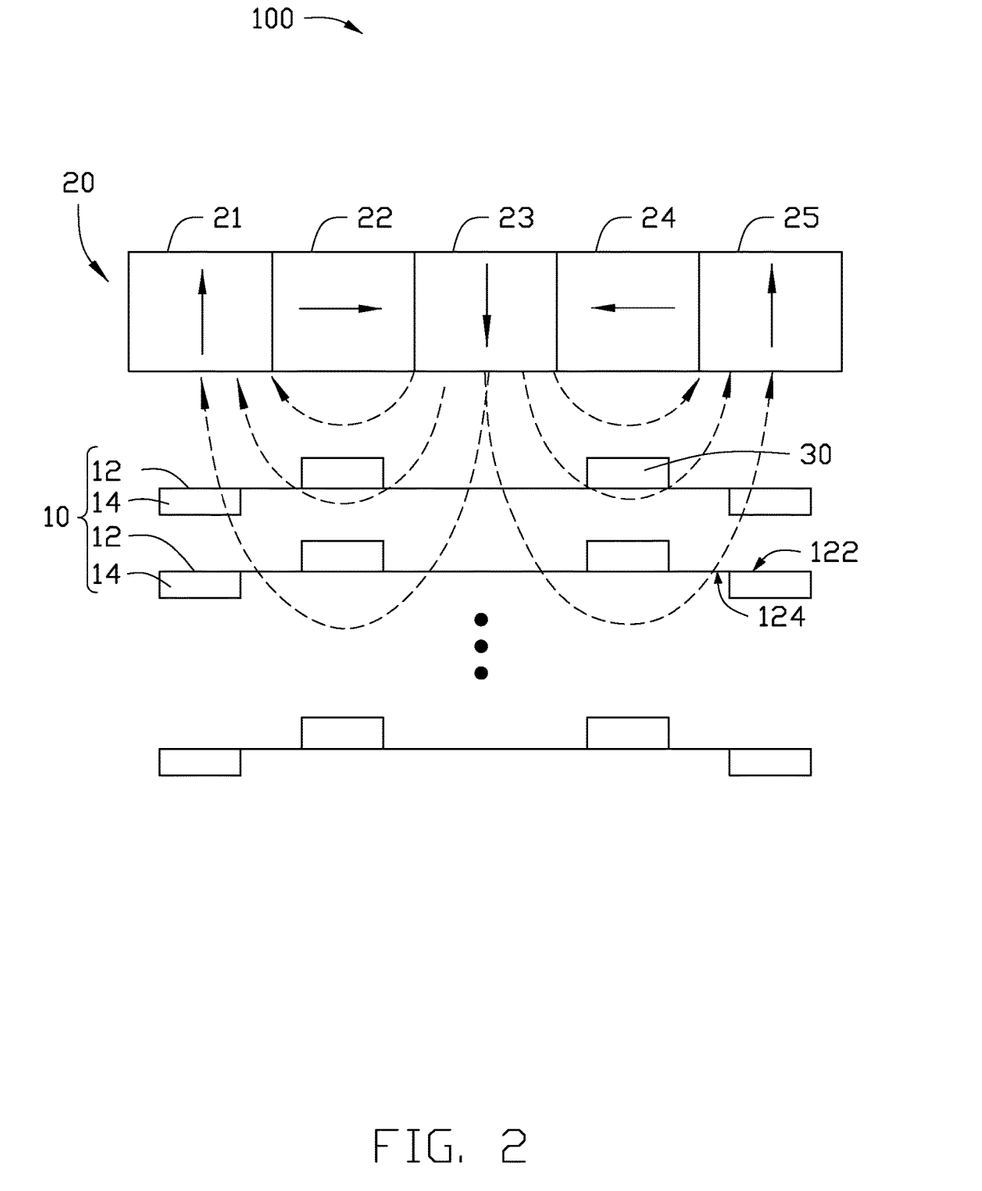
FIG. 2 is another diagram of the electromagnetic sensor of FIG. 1.
Figure 3:
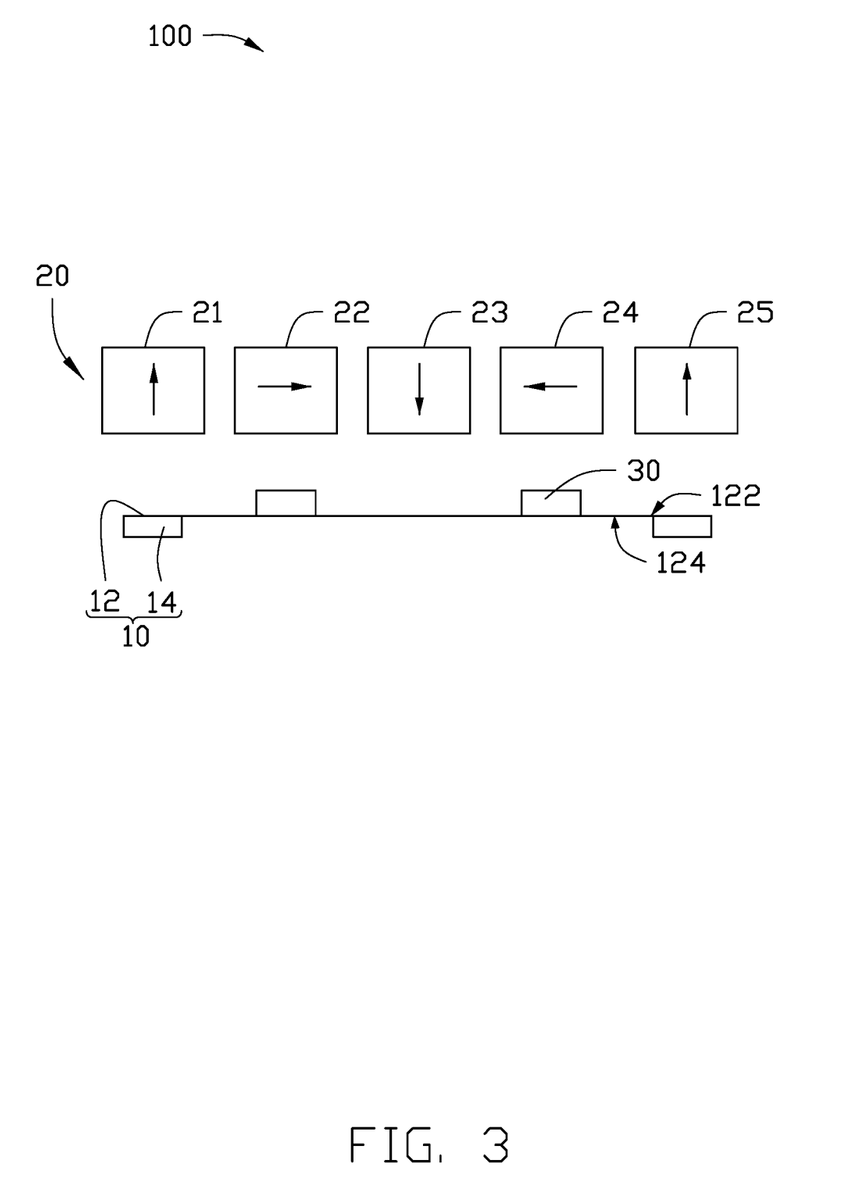
FIG. 3 is another diagram of the electromagnetic sensor of FIG. 1.

FIGS. 1-3 illustrate an electromagnetic sensor 100 in accordance with a first exemplary embodiment.

The electromagnetic sensor 100 comprises a first diaphragm unit 10, a first magnet group 20, and a plurality of electrodes 30. The first diaphragm unit 10 comprises a first diaphragm 12.

The first magnet group 20 is defined on a side of the first diaphragm 12. A magnetic axis direction of the first magnet group 20 is indicated by an arrow. The first magnet group 20 comprises at least five magnetic groups. In this exemplary embodiment, the first magnet group 20 comprises a first magnetic group 21, a second magnetic group 22, a third magnetic group 23, a fourth magnetic group 24, and a fifth magnetic group 25. The five magnetic groups are arranged in the same line.

A magnetic axis direction of the first magnetic group 21 is perpendicular to the first diaphragm 12;

A magnetic axis direction of a first magnetic group 22 is perpendicular to the magnetic axis direction of the first magnetic group 21, and points toward to the third magnetic group 23;

A magnetic axis direction of the third magnetic group 23 is perpendicular to the first diaphragm 12, and is different from the magnetic axis direction of the first magnetic group 21 by 180 degrees;

A magnetic axis direction of the fourth magnetic group 24 is perpendicular to the magnetic axis direction of the third magnetic group 23, and points toward to the third magnetic group 23;

A magnetic axis direction of the fifth magnetic group 25 is perpendicular to the first diaphragm 12, and is the same as the magnetic axis direction of the first magnetic group 21.

In at least one exemplary embodiment, only five magnetic axis direction groups are described.

In other exemplary embodiments, the first magnet group 20 may also sequentially form a plurality of magnetic axis direction groups in the first direction, the specific direction can be adjusted according to actual needs.

In at least one exemplary embodiment, the electrodes 30 are on a first surface 122 of the first diaphragm 12, a plurality of support modules 14 defined on a second surface 124 of the first diaphragm 12, and the second magnetic group 22 and the fourth magnetic group 24 respectively corresponds to one electrode 30. When current passes through the electrodes 30, the first diaphragm 12 of the first diaphragm unit 10 and the air surrounding it vibrate and emit sound.

By virtue of the arrangement between the first magnet group 20 and the electrode 30, a larger magnet power density can be obtained, and the magnetic force of the electrode 30 is greatly increased.

In at least one exemplary embodiment, the first magnet group 20 comprises a plurality of magnets (not shown), each of which are connected in turn between each of the magnets in the first magnet group 20.

In at least one exemplary embodiment, each magnet in the first magnet group 20 may also be spaced apart by a predetermined distance. In this way, a larger magnet power density can be obtained, so that the magnetic force of the electrode is greatly improved.

Figure 4:
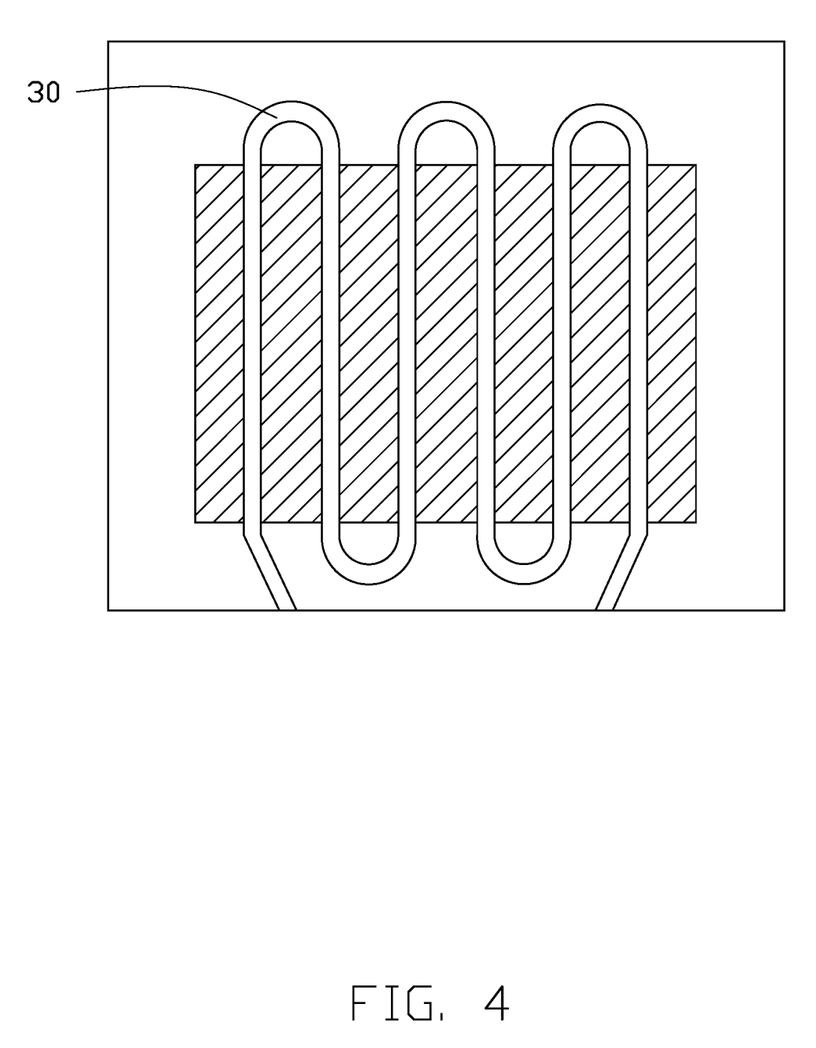
FIG. 4 is diagram of an electrode of the electromagnetic sensor of FIG. 1.
Figure 5:
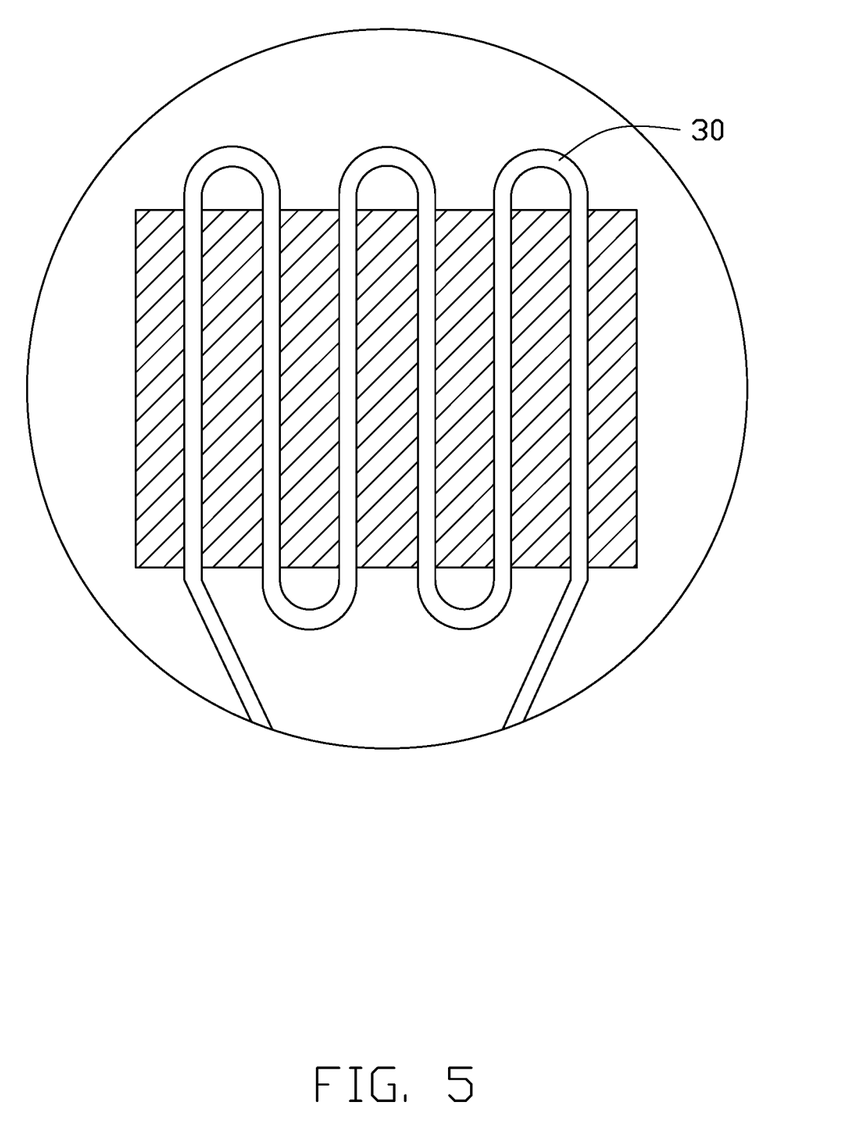
FIG. 5 is another diagram of the electrode of the electromagnetic sensor of FIG. 1.
Figure 6:
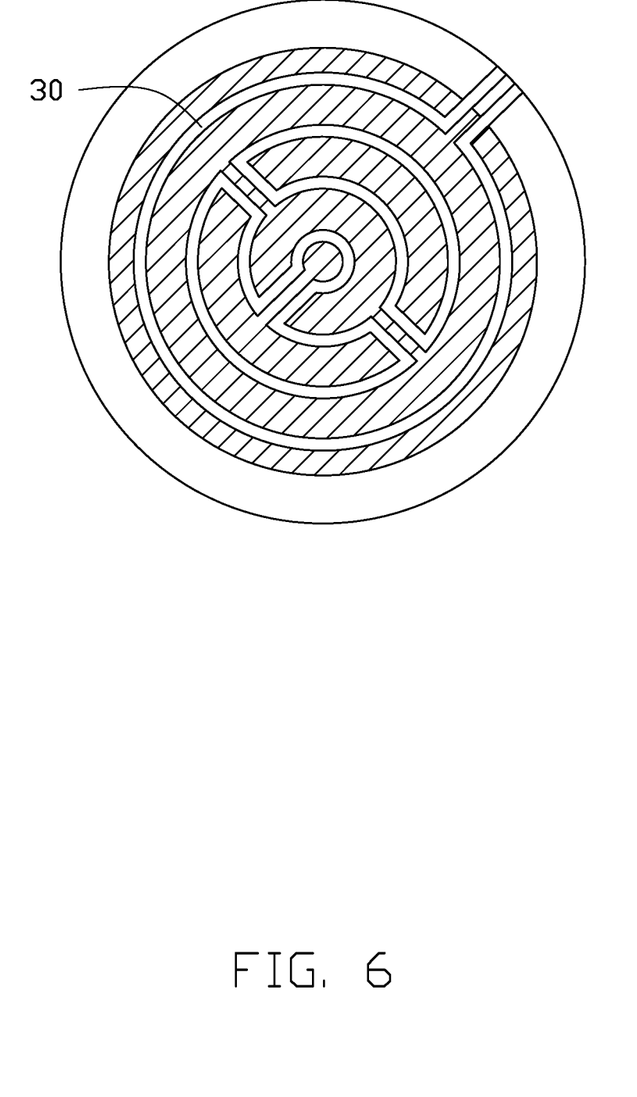
FIG. 6 is another diagram of the electrode of the electromagnetic sensor of FIG. 1.

FIGS. 4-5 illustrate that the electrode 30 can have a generally rectangular shape. FIG. 6 illustrate that the electrode 30 can have a generally circular shape. It is to be understood that the rectangle or circle here is used only to assist in illustrating the embodiment of the electrode 30, and is not intended to define the shape of the electrode 30.

Figure 7:
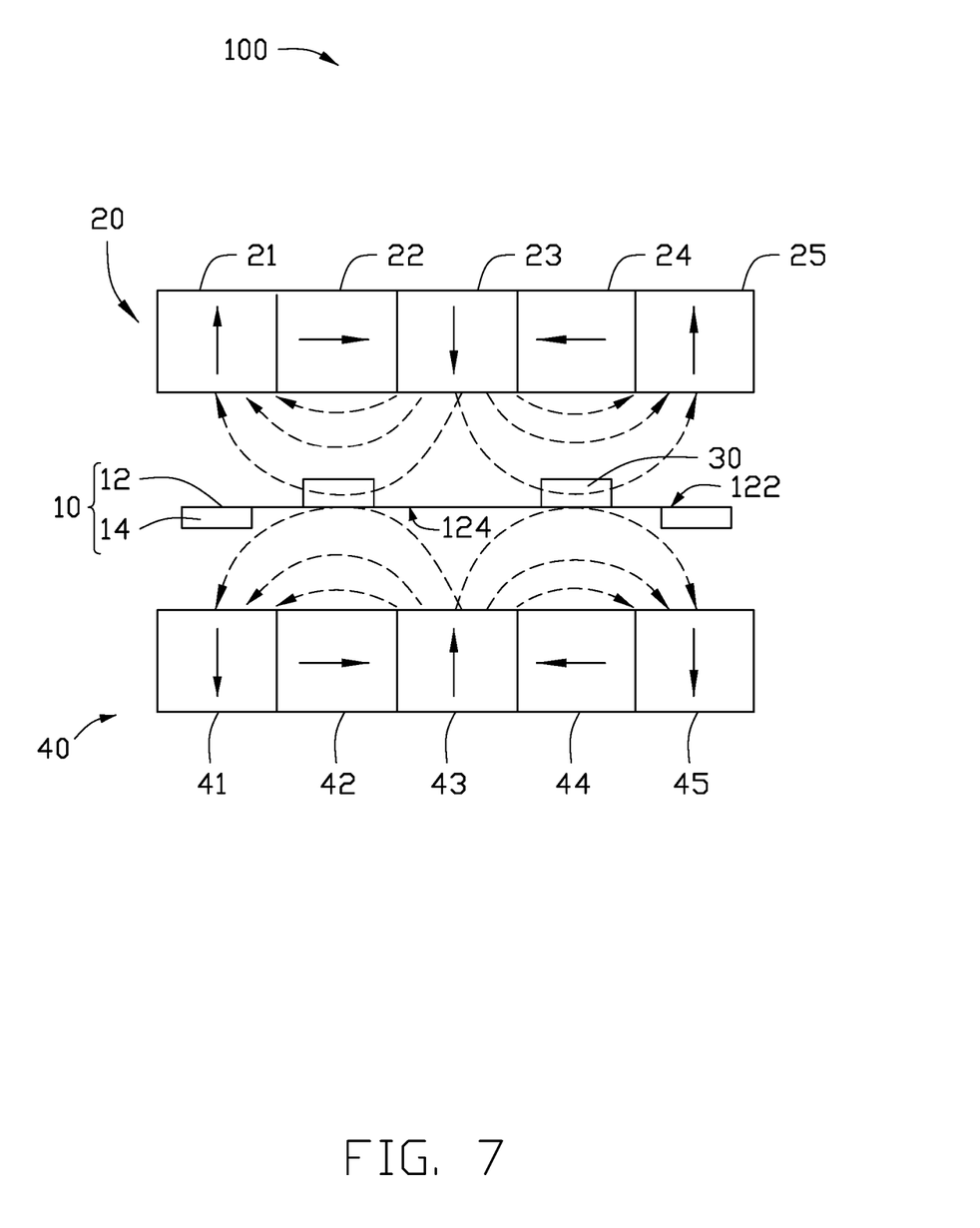
FIG. 7 is a diagram of another exemplary embodiment of the electromagnetic sensor according to the present disclosure.

Referring to FIG. 7, the electromagnetic sensor 100 of this embodiment further comprises a second magnet group 40, and the second magnet group 40 has the same structure as the first magnet group 20 shown in FIG. 1. The first magnet group 20 and the second magnet group 40 are symmetrically disposed on both sides of the first diaphragm unit 10.

A magnetic axis direction of the second magnet group 40 is indicated by an arrow. The second magnet group 40 comprises at least five magnetic groups. In this exemplary embodiment, the second magnet group 40 comprises a first magnetic group 41, a second magnetic group 42, a third magnetic group 43, a fourth magnetic group 44, and a fifth magnetic group 45. The five magnetic groups are arranged in the same line.

A magnetic axis direction of the first magnetic group 41 is perpendicular to the first diaphragm 12, and is opposite to the magnetic axis direction of the first magnetic group 21;

A magnetic axis direction of the second magnetic group 42 is the same as the magnetic axis direction of the second magnetic group 22;

A magnetic axis direction of the third magnetic group 43 is perpendicular to the first diaphragm 12, and is opposite to the direction of the magnetic axis of the third magnetic group 23;

A magnetic axis direction of the fourth magnetic group 44 is the same as the magnetic axis direction of the fourth magnetic group 24;

A magnetic axis direction of the fifth magnetic group 45 is perpendicular to the first diaphragm 12, and is opposite to the magnetic axis direction of the fifth magnetic group 25.

In at least one exemplary embodiment, the second magnet group 40 comprises a plurality of magnets (not shown), and each of the second magnets 20 is connected in series.

In other exemplary embodiments, each of the magnets in the second magnet group 20 may also be spaced apart by a predetermined distance.

Figure 8:
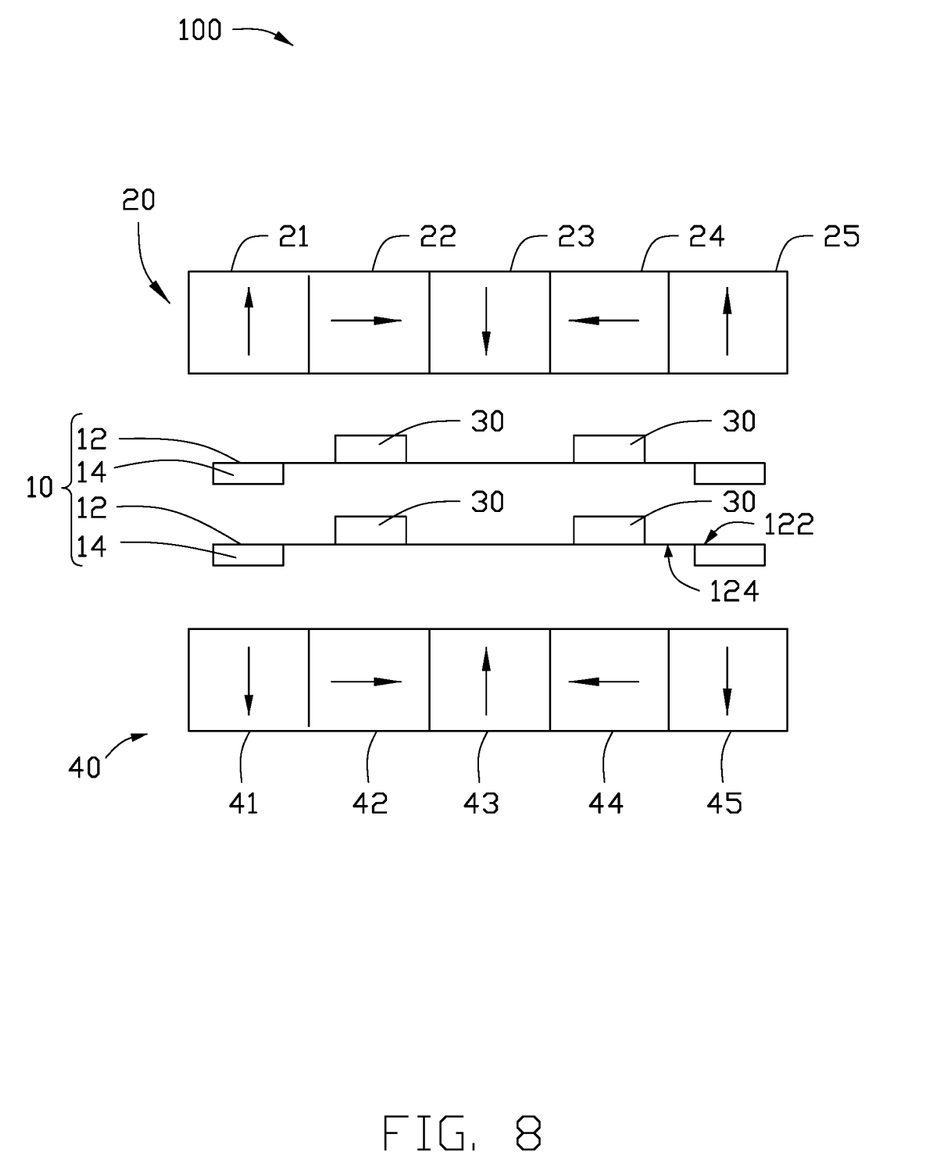
FIG. 8 is a diagram of an electrode of the electromagnetic sensor of FIG. 7.

FIG. 8 illustrates that the first diaphragm unit 10 comprises two first diaphragms 12. The first magnet group 20 and the second magnet group 40 are symmetrically arranged on both sides of the first diaphragm unit 10.

Figure 9:
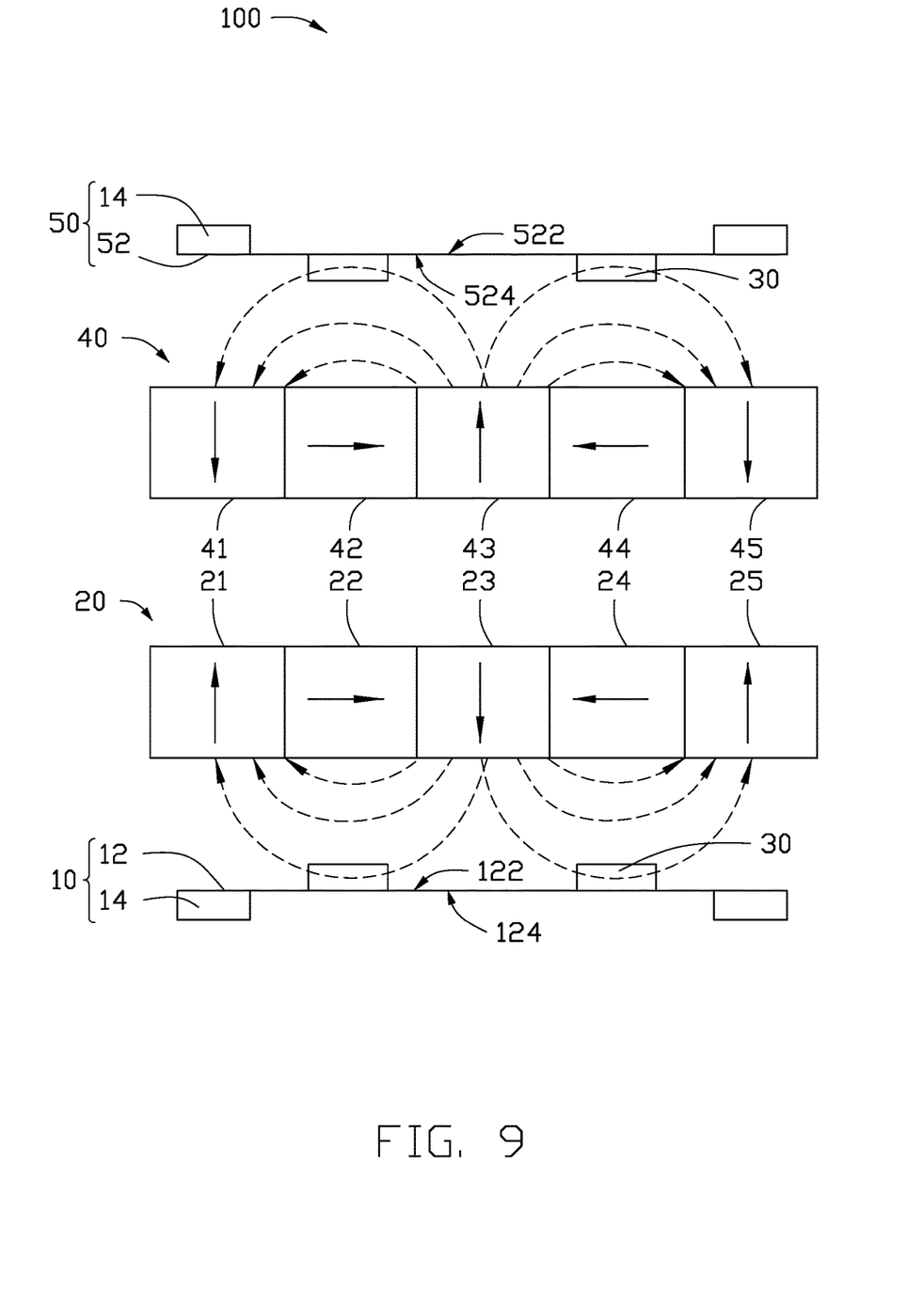
FIG. 9 is diagram of another exemplary embodiment of the electromagnetic sensor according to the present disclosure.

FIG. 9 illustrates another exemplary embodiment of electromagnetic sensor 100. The electromagnetic sensor 100 of this embodiment further comprises a second diaphragm unit 50. The first magnet group 20 is disposed symmetrically with the second magnet group 40. The first diaphragm unit 10 and the second diaphragm unit 50 are symmetrically on both sides of the first magnet group 20 and the second magnet group 40.

In this exemplary embodiment, the first diaphragm unit 10 comprises a first diaphragm 12, the second diaphragm unit 50 comprises a second diaphragm 52. The second diaphragm 52 has the same structure as the first diaphragm 12. The electrodes 30 is disposed on the first surface 122 of the first diaphragm 12, the plurality of support modules 14 are defined on the second surface 124 of the first diaphragm 12, and the second magnetic group 22 and the fourth magnetic group 24 respectively corresponds to one electrode 30. The electrodes 30 is also disposed on a first surface 522 of the second diaphragm 52, the plurality of support modules 14 are defined on a second surface 524 of the second diaphragm 52, and the second magnetic group 42 and the fourth magnetic group 44 respectively corresponds to one electrode 30.

Figure 10:
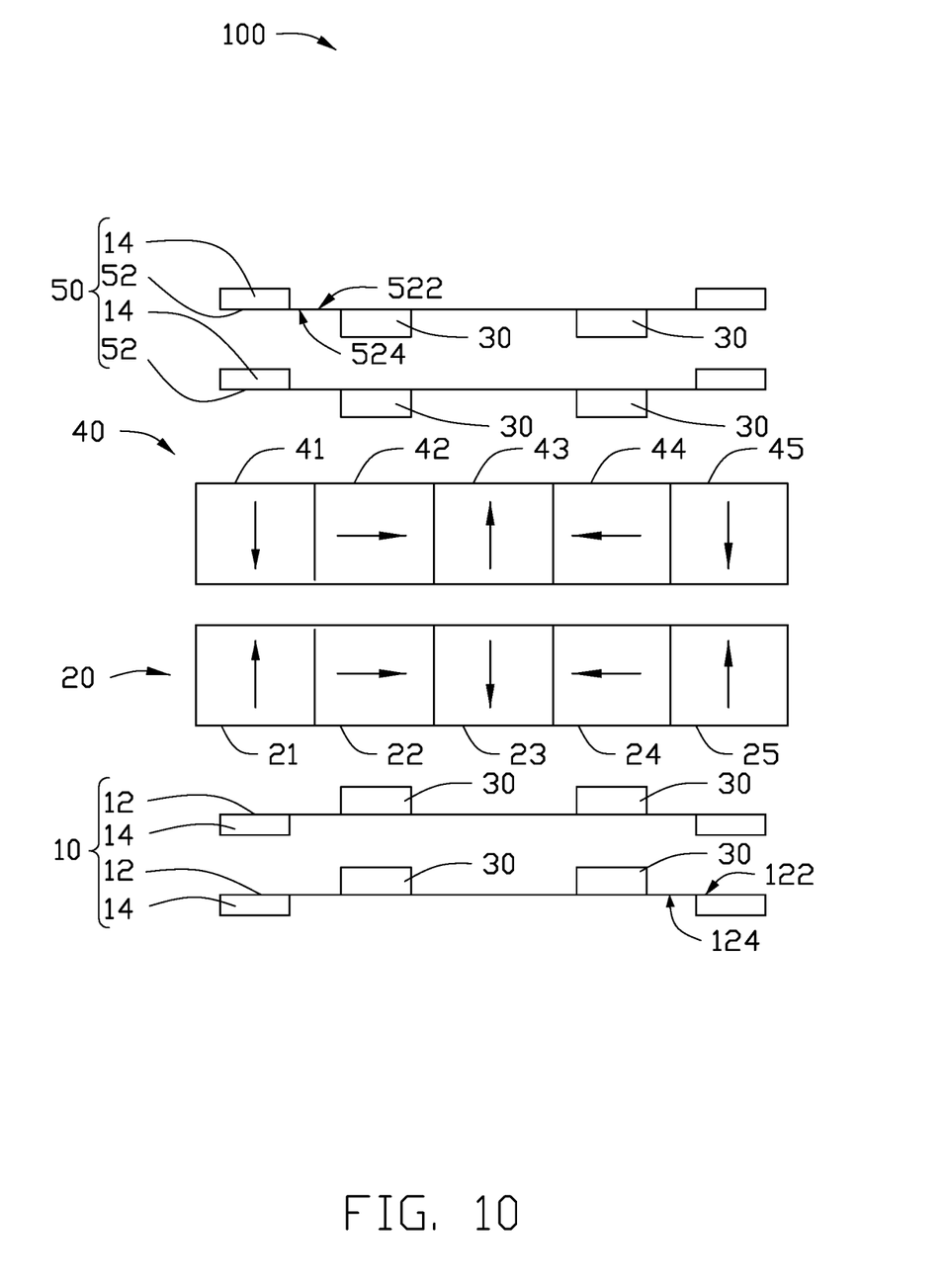
FIG. 10 is another diagram of the electrode of the electromagnetic sensor of FIG. 8.

FIG. 10 illustrates that the first diaphragm unit 10 comprises two first diaphragms 12. The second diaphragm unit 50 comprises two second diaphragms 52.

In other exemplary embodiments, the first diaphragm unit 10 may further comprise the first diaphragm 12 arranged in a number of layers. The second diaphragm unit 50 may further comprise the second diaphragm 52 arranged in a number of layers.

The second surface 524 of the second diaphragm 52 is similarly provided with a plurality of support modules 14. Each second diaphragm 52 is spaced from each other by these support modules 14, so that the air between each second diaphragm 52 can be subject to convection.

The above-mentioned electromagnetic sensor distributes the magnetic field evenly on the electrode, and can also produce different frequencies to get a good sound effect.

The exemplary embodiments shown and described above are only examples. Many details are often found in the art such as the other features of electromagnetic sensor. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. An electromagnetic sensor comprising:
   a first diaphragm unit comprising a first diaphragm;
   a first magnet group defined on a side of the first diaphragm, and the first magnet group comprises a first magnetic group, a second magnetic group, and a third magnetic group; wherein a magnetic axis direction of the first magnetic group is perpendicular to the first diaphragm; a magnetic axis direction of the second first magnetic group is perpendicular to the magnetic axis direction of the first magnetic group, and points toward to a third magnetic group; and a magnetic axis direction of the third magnetic group is perpendicular to the first diaphragm, and is different from the magnetic axis direction of the first magnetic group by 180 degrees; and
   a plurality of electrode disposed on a first surface of the first diaphragm and corresponded to the second magnetic group;
   wherein when current passes through each electrode, the first diaphragm and the air surrounding vibrate and emit sound.

2. The electromagnetic sensor of claim 1, wherein the first magnet group further comprises a fourth magnetic group and a fifth magnetic group, a magnetic axis direction of the fourth magnetic group is perpendicular to the magnetic axis direction of the third magnetic group, and points toward to the third magnetic group; a magnetic axis direction of the fifth magnetic group is perpendicular to the first diaphragm, and is the same as the magnetic axis direction of the first magnetic group.

3. The electromagnetic sensor of claim 2, wherein the plurality of electrode further disposes on the first surface of the first diaphragm and corresponds to the fourth magnetic group.

4. The electromagnetic sensor of claim 1, wherein the electromagnetic sensor further comprises a plurality of support modules, the plurality of support modules are defined on a second surface of the first diaphragm.

5. The electromagnetic sensor of claim 1, wherein the shape of the electrode is rectangular.

6. The electromagnetic sensor of claim 3, wherein the electromagnetic sensor further comprises a second magnet group, the second magnet group has the same structure as the first magnet group, and the first magnet group and the second magnet group are symmetrically disposed on both sides of the first diaphragm unit.

7. The electromagnetic sensor of claim 3, wherein the electromagnetic sensor further comprises a second magnet group and a second diaphragm unit, the second magnet group has the same structure as the first magnet group, the first magnet group disposes symmetrically with the second magnet group, and the first diaphragm unit and the second diaphragm unit are symmetrically provided on both sides of the first magnet group and the second magnet group.

8. The electromagnetic sensor of claim 7, wherein the second diaphragm unit comprises a second diaphragm, the second diaphragm has the same structure as the first diaphragm, and the electrode is defined on a first surface of the second diaphragm.

9. The electromagnetic sensor of claim 1, wherein the first magnet group comprises a plurality of magnets, and each of the magnets is connected in series.

10. The electromagnetic sensor of claim 1, wherein the first magnet group comprises a plurality of magnets, and each of the magnets is spaced apart by a predetermined distance.

11. An electromagnetic sensor comprising:
a first diaphragm unit comprising a first diaphragm;
a first magnet group defined on a side of the first diaphragm, and the first magnet group comprises a first magnetic group, a second magnetic group, and a third magnetic group; wherein a magnetic axis direction of the first magnetic group is perpendicular to the first diaphragm; a magnetic axis direction of the second first magnetic group is perpendicular to the magnetic axis direction of the first magnetic group, and points toward to a third magnetic group; and a magnetic axis direction of the third magnetic group is perpendicular to the first diaphragm, and is different from the magnetic axis direction of the first magnetic group by 180 degrees; a magnetic axis direction of the fourth magnetic group is perpendicular to the magnetic axis direction of the third magnetic group, and points toward to the third magnetic group; a magnetic axis direction of the fifth magnetic group is perpendicular to the first diaphragm, and is the same as the magnetic axis direction of the first magnetic group;
a plurality of electrode disposed on a first surface of the first diaphragm and corresponded to the second magnetic group;
wherein when current passes through each electrode, the first diaphragm and the air surrounding vibrate and emit sound.

12. The electromagnetic sensor of claim 11, wherein the plurality of electrode further disposes on the second surface of the first diaphragm and corresponds to the fourth magnetic group.

13. The electromagnetic sensor of claim 11, wherein the electromagnetic sensor further comprises a plurality of support modules, the plurality of support modules are defined on a second surface of the first diaphragm.

14. The electromagnetic sensor of claim 11, wherein the shape of the electrode is rectangular.

15. The electromagnetic sensor of claim 12, wherein the electromagnetic sensor further comprises a second magnet group, the second magnet group has the same structure as the first magnet group, and the first magnet group and the second magnet group are symmetrically disposed on both sides of the first diaphragm unit.

16. The electromagnetic sensor of claim 12, wherein the electromagnetic sensor further comprises a second magnet group and a second diaphragm unit, the second magnet group has the same structure as the first magnet group, the first magnet group is disposed symmetrically with the second magnet group, and the first diaphragm unit and the second diaphragm unit are symmetrically provided on both sides of the first magnet group and the second magnet group.

17. The electromagnetic sensor of claim 16, wherein the second diaphragm unit comprises a second diaphragm, the second diaphragm has the same structure as the first diaphragm, and the electrode is defined on a first surface of the second diaphragm.

18. The electromagnetic sensor of claim 11, wherein the first magnet group comprises a plurality of magnets, and each of the magnets is connected in series.

19. The electromagnetic sensor of claim 11, wherein the first magnet group comprises a plurality of magnets, and each of the magnets is spaced apart by a predetermined distance.

* * * * *